(12) United States Patent
Yoo

(10) Patent No.: US 6,404,667 B1
(45) Date of Patent: Jun. 11, 2002

(54) 2T-1C FERROELECTRIC RANDOM ACCESS MEMORY AND OPERATION METHOD THEREOF

(75) Inventor: In-Kyeong Yoo, Yongin (KR)

(73) Assignees: Samsung Electronics Co., Ltd., Suwon (KR); Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 09/658,942

(22) Filed: Sep. 11, 2000

(51) Int. Cl.$^7$ ............................................. G11C 11/22
(52) U.S. Cl. ................... 365/145; 365/210; 365/189.04
(58) Field of Search .............................. 365/145, 210, 365/189.04, 102, 104, 65

(56) References Cited

U.S. PATENT DOCUMENTS

| | | | | |
|---|---|---|---|---|
| 5,524,093 A | * | 6/1996 | Kuroda | 365/145 |
| 5,808,929 A | * | 9/1998 | Sheikholeslami et al. | 365/49 |
| 5,914,504 A | * | 6/1999 | Augusto | 257/192 |
| 5,930,161 A | * | 7/1999 | Sheikholeslami et al. | 365/49 |

\* cited by examiner

Primary Examiner—David Nelms
Assistant Examiner—Thong Le
(74) Attorney, Agent, or Firm—The Law Offices of Eugene M. Lee, PLLC

(57) ABSTRACT

A 2T-1C FRAM, each cell of which includes two transistors and one ferroelectric capacitor so that the "charging" and "discharging" of the ferroelectric capacitor used in conjunction with the p-n junction of the two transistors performs write/read operations without switching thereby avoiding degradation problems such as fatigue and imprint in the 2T-1C FRAM.

13 Claims, 6 Drawing Sheets

2T-1C FERROELECTRIC RANDOM ACCESS MEMORY AND OPERATION METHOD THEREOF

BACKGROUND OF THE INVENTION

1. Field of the Invention

The present invention relates to a ferroelectric random access memory and an operation method thereof. More specifically, the present invention relates to a ferroelectric random access memory, which is to be referred to as a 2T-1C FRAM, each cell of which is provided with two transistors (2T) and one ferroelectric capacitor (1C), and an operation method thereof.

2. Description of the Related Art

A conventional ferroelectric random access memory (FRAM) is based on switching of a ferroelectric capacitor. In a bistable polarization state, positive polarization is assigned as "1" and negative polarization is assigned as "0". A novel concept is based on the charging and the discharging of a ferroelectric capacitor in conjunction with a p-n junction of CMOS transistors. This novel structure does not require switching. Therefore, the novel structure can avoid degradation issues such as fatigue and imprint. such as fatigue and imprint.

A conventional FRAM utilizes a bistable state of ferroelectric polarization, wherein positive polarization and negative polarization states are assigned as "1" and "0", respectively, for memory logic. As long as the FRAM is switched to maintain bistable polarization states, reliability issues such as fatigue, imprint, impulse breakdown, and the like have made it difficult to fabricate reliable FRAM products.

SUMMARY OF THE INVENTION

A feature of the present invention is to provide a 2T-1C FRAM using the "charging" and "discharging" states of a ferrroelectric capacitor in conjunction with a p-n junction of CMOS transistors, to overcome degradation such as fatigue and imprint. An operation method thereof is also disclosed.

The present invention provides a 2T-1C ferroelectric random access memory comprising: a semiconductor substrate having a plurality of potential wells formed by doping it with first impurities; a plurality of memory cells each having two transistors and one capacitor; a plurality of connection lines electrically connecting the memory cells in the form of a matrix; and a plurality of dummy capacitors, wherein the two transistors include: a source formed by doping the semiconductor within each potential well with second impurities; a first drain and a second drain formed by doping the semiconductor within each potential well with the second impurities in a predetermined interval, respectively, so as to be arranged in line with the source in a first direction; a first gate formed on an insulation layer which is formed on a first channel between the source and the first drain; and a second gate formed on an insulation layer which is formed on a second channel between the first drain and the second drain, and wherein the one capacitor includes: a bottom electrode formed on an insulation layer which is formed on the source; a ferroelectric layer formed on the bottom electrode; and a top electrode formed on the ferroelectric layer, and wherein the connection lines include: first word lines connecting the first gates arranged in the first direction in each memory cell; bit lines connecting the first drains of the memory cells arranged in the second direction, which is perpendicular to the first direction, and to which the dummy capacitors are commonly connected; second word lines connecting the second gates of the memory cells arranged in the second direction; sensing lines connecting the second drains of the memory cells arranged in the second direction; contact plugs connecting the source and the bottom electrode in each cell; and plate lines connecting the top electrodes of the memory cells arranged in the second direction.

In a preferred embodiment of the present invention, the first impurities are "p" type impurities and the second impurities are "$n^+$" type impurities. In an alternative embodiment, the first impurities may be "n" type impurities and the second impurities may be "$p^+$" type impurities.

The sensing lines connecting the second drains of the memory cells may be arranged in the first direction.

The dummy capacitor may be formed between the bit line and the first drain of each cell.

Additionally, the present invention provides, a method for operating a 2T-1C ferroelectric random access memory comprising: a semiconductor substrate having a plurality of potential wells formed by doping it with first impurities; a plurality of memory cells each having two transistors and one capacitor; a plurality of connection lines electrically connecting the memory cells in the form of a matrix; and a plurality of dummy capacitors, wherein the two transistors include: a source formed by doping the semiconductor within each potential well with second impurities; a first drain and a second drain formed by doping the semiconductor within each potential well with the second impurities in a predetermined interval, respectively, so as to be arranged in line with the source in a first direction; a first gate formed on an insulation layer which is formed on a first channel between the source and the first drain; and a second gate formed on an insulation layer which is formed on a second channel between the first drain and the second drain, and wherein the one capacitor includes: a bottom electrode formed on an insulation layer which is formed on the source; a ferroelectric layer formed on the bottom electrode; and a top electrode formed on the ferroelectric layer, and wherein the connection lines include: first word lines connecting the first gates arranged in the first direction in each memory cell; bit lines connecting the first drains of the memory cells arranged in the second direction, which is perpendicular to the first direction, and to which the dummy capacitors are commonly connected; second word lines connecting the second gates of the memory cells arranged in the second direction; sensing lines connecting the second drains of the memory cells arranged in the second direction; contact plugs connecting the source and the bottom electrode in each cell; and plate lines connecting the top electrodes of the memory cells arranged in the second direction, the method comprising the steps of: (a) writing "0" state in a selected memory cell by applying a voltage Vw to the first word line and a voltage Vp to the plate line; (b) writing "1" state in a selected memory cell by applying a voltage Vw to the first word line and a voltage Vc to the second word line; and (c) reading the written state out by applying a voltage Vw to the first word line and a voltage Vc to the second word line and detecting negative charge at the selected memory cell.

In the step (c), the negative charge is detected at the selected memory cell via the sensing line connected to it. Also, in the step (c), if the negative charge is detected at the selected memory cell, the state of the selected memory cell is read out as "0" state. If the negative charge is not detected at the selected memory cell, the state of the selected memory cell is read out as "1" state. The step (c) may further comprise the step of restoring "0" state in the selected memory cell immediately after the selected memory cell is read out as "0" state, so that "0" state is maintained.

BRIEF DESCRIPTION OF THE DRAWINGS

The above-described features and advantages of the present invention will become more apparent by describing in detail a preferred embodiment of the present invention with reference to the attached drawings in which:

More specifically, FIG. 3a and FIG. 3b illustrate a process writing a "1" to a cell, and a state of discharging, respectively;

FIG. 3c and FIG. 3d illustrate a process writing a "1" to a cell, and a state of discharging, respectively;

FIG. 4a illustrates a process for reading a "0" out from a cell;

FIG. 4b illustrates a process for reading a "1" out from a cell;

DETAILED DESCRIPTION OF THE PREFERRED EMBODIMENTS

Figure 1:
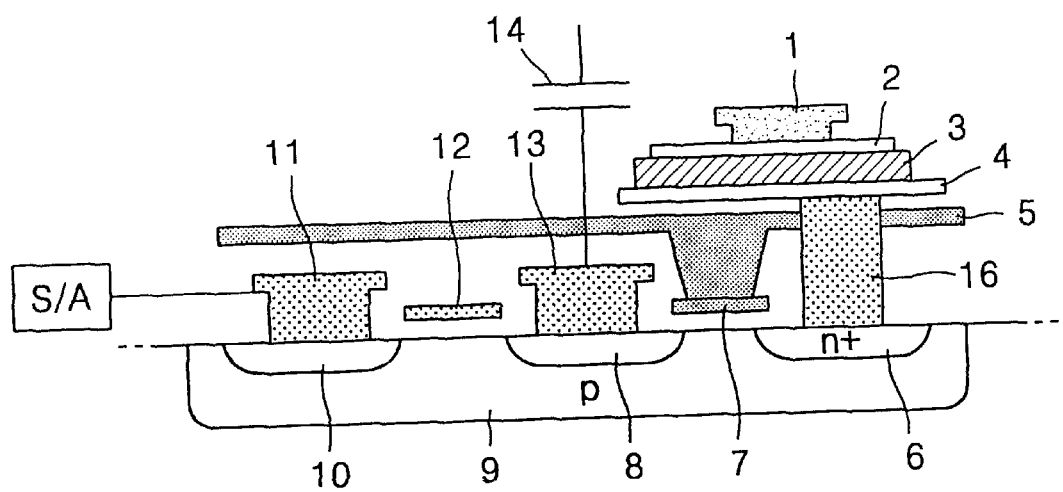
FIG. 1 is a schematic, cross-sectional view of a cell of a 2T-1C FRAM according to an embodiment of the present invention.
Figure 2:
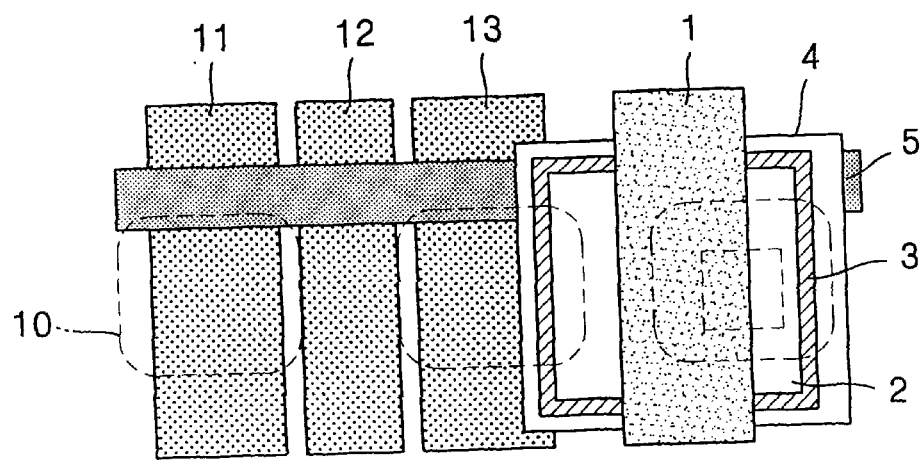
FIG. 2 is a schematic, planar view of a cell of a 2T-1C FRAM as depicted in FIG. 1.

FIG. 1 is a schematic, cross-sectional view of a cell of a 2T-1C FRAM according to an embodiment of the present invention. FIG. 2 is a schematic, planar view of the cell of a 2T-1C FRAM as depicted in FIG. 1. In FIG. 1, reference numeral 9 denotes a potential well which is doped with first impurities. A source 6, a first drain 8 and a second drain 10 are regions doped with second impurities in the potential well 9. In the present invention, the first impurities are "p" or "n" type impurities, and the second impurities corresponding to the first impurities are "n$^+$" or "p$^+$" type impurities. In other words, if the first impurities are "p" type impurities, the second impurities are "n$^+$" type impurities. If the first impurities are "n" type impurities, the second impurities are "p$^+$" type impurities. An embodiment of the present invention will be described on the assumption that the first impurities are "p" type impurities and the second impurities are "n$^+$" type impurities.

In the structure of the 2T-1C FRAM, each cell consists of two transistors (6,7,8 and 8,12,10) with a common diffusion layer 8, that is, the first drain doped with "n$^+$" type impurities, and one ferroelectric capacitor (2,3,4). A dummy capacitor 14 is connected to the bit line 13. The dummy capacitor 14 can be fabricated either at the end of the bit line 13 as a common dummy capacitor or between the first drain 8 and the bit line 13. A first word line 5 is connected to a floating gate 7. A second transistor consists of the common diffusion layer 8, a second word line 12, and the second drain 10 as a diffusion layer doped with "n$^+$" type impurities. The second drain 10 is connected to a sensing line 11. A sense amplifier S/A is connected to the sensing line 11. A source 6 is connected to the ferroelectric capacitor (2,3,4) by a contact plug 16 to form a typical COB (capacitor on bit line) structure. However, the ferroelectric capacitor (2,3,4) can be fabricated on the field oxide for a low integration density memory. A top electrode 2 is connected to a plate line 1. The plate line 1, the bit line 13, and the second word line 12 are perpendicular to the first word line 5.

The operation principle of the 2T-1C FRAM having a structure as described above is illustrated as follows.

As a matter of convenience, an n-p-n transistor is chosen to explain the operational principle. However, the same principle may be applied to a p-n-p type transistor by simply considering opposite current and switching directions.

Figure 3A:
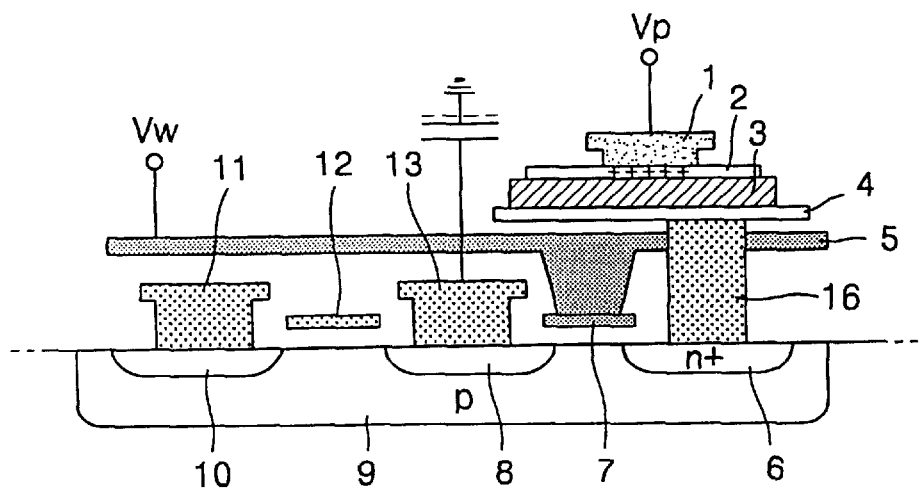
FIGS. 3a through 3d illustrate a method for writing information to the cell of a 2T-1C FRAM shown in FIG. 1.

The write "0" is carried out by applying voltages to the first word line 5, as high as a word line voltage Vw, and to the plate line 1, as high as a plate line voltage Vp. Then the ferroelectric capacitor (2,3,4) is polarized to the downward direction. In order to compensate for the electric dipole of the ferroelectric, positive charges are induced at the top electrode 2, and negative charges are induced at the top electrode of the dummy capacitor 14. FIG. 3a shows the initial stage of the write "0". Once voltage application is finished, the negative charges flow to some other place to make static electric balance. Since the source 6, an "n$^+$" type diffusion layer, forms a p-n junction with the well 9, junction capacitance exists at the p-n junction, and charge flow is interrupted by the junction because of the reverse bias state.

Figure 3B:
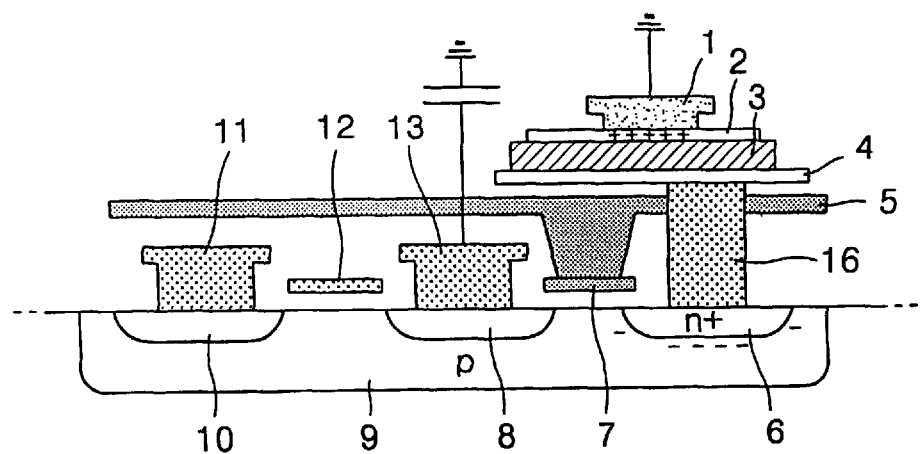

Consequently, negative charges accumulate at the p-n junction of the first transistor. This is the normal state of the write "0" as illustrated in FIG. 3b. This state is called "charging", because the p-n junction is charged at this stage.

Figure 3C:
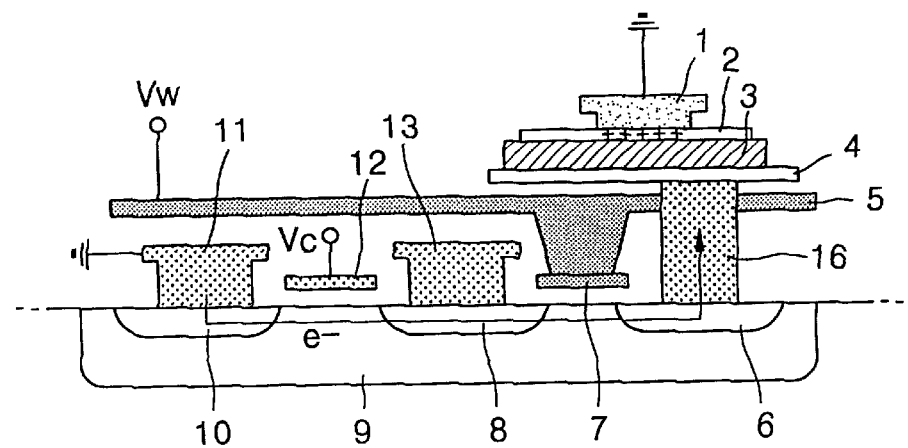
Figure 3D:
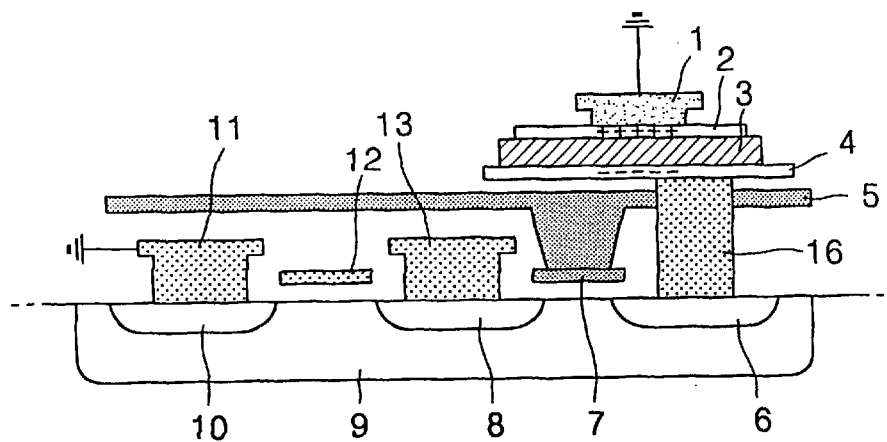

The negative charges at the p-n junction can be eliminated by supplying negative charges to the bottom electrode 4. When the word line voltage Vw is applied to the first word line 5 and the control voltage Vc is applied to the second word line 12, channels are formed for both transistors and negative charge can flow from the sensing line 11 to the bottom electrode 4. Once negative charges in the bottom electrode 4 make electric balance with the ferroelectric dipoles, previous negative charges at the p-n junction disappear by a discharging process. This is called "discharging" and is assigned as "1". This process is shown in FIG. 3c and FIG. 3d.

Figure 4A:
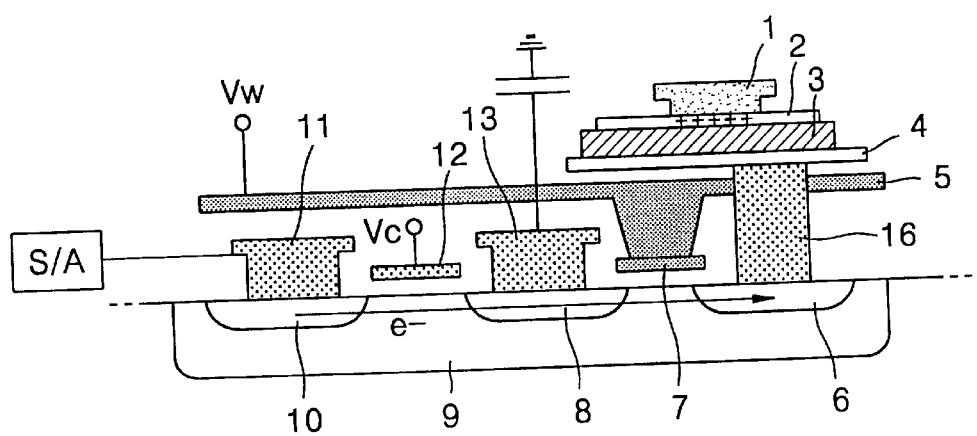
FIGS. 4a and 4b illustrate a method for reading information out from a cell of a 2T-1C FRAM as depicted in FIG. 1.
Figure 4B:
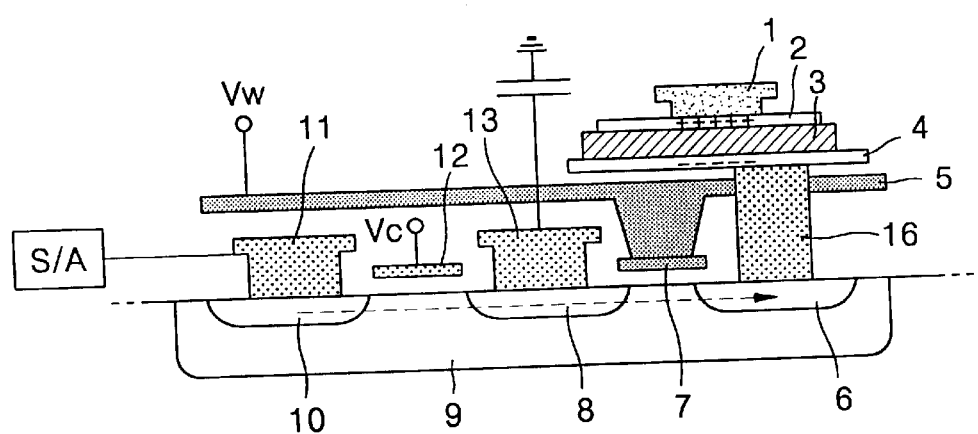

In order to read "0", the word line voltage Vw is applied to the first word line 5 and the control voltage Vc is applied to the second word line 12, then negative charges flow through sensing line 11 where the sense amplifier which detects negative charges is connected. The same process is applied for reading "1". In this case, no charge is detected. Therefore, "0" is called "on" state and "1" is called "off" state. The read "0" process destroys the "0" state. Therefore, a restoration process or recovery process is required to maintain the state "0" after a read "0" process. The restoration is carried out by applying write "0". FIGS. 4a and 4b show a read process.

Figure 5A:
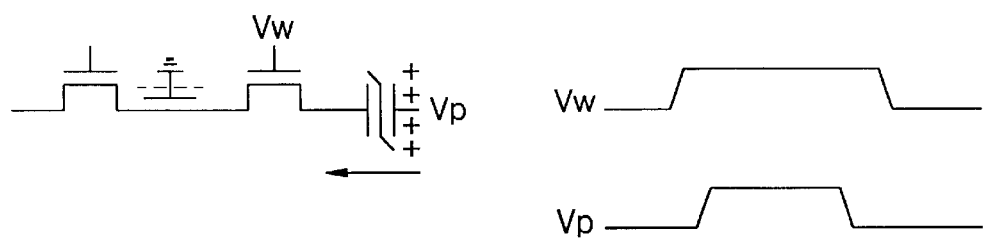
FIG. 5 depicts equivalent circuits illustrating a writing process shown in FIGS. 3a through 3d and a reading process shown in FIGS. 4a and 4b, and the waveforms of signals applied in the same processes.
Figure 5B:
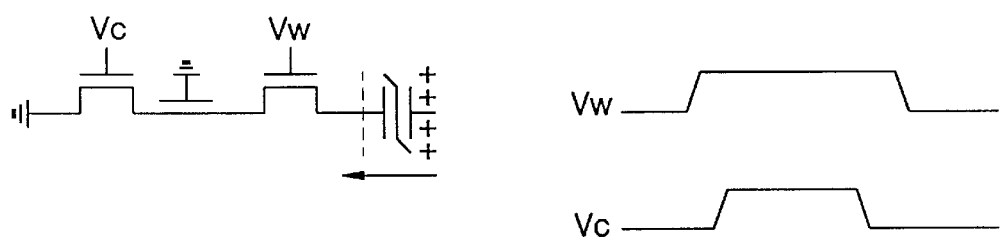
Figure 5C:
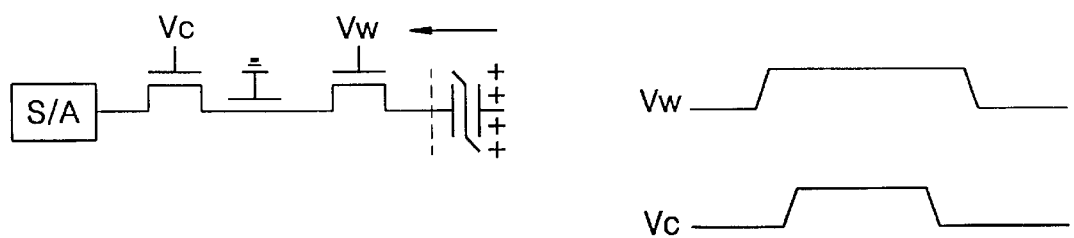
Figure 6:
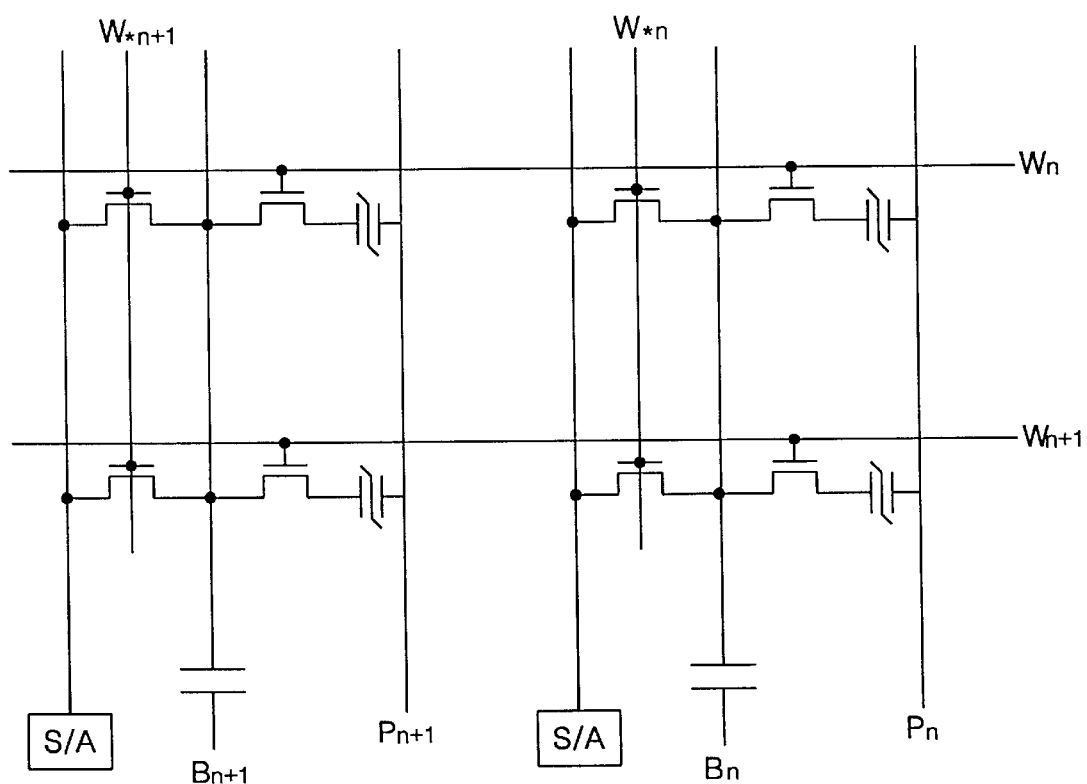
FIG. 6 depicts an equivalent circuit of a 2T-1C FRAM formed with an array of, cells as depicted in FIG. 1.

FIG. 5 shows an equivalent circuit of the 2T-1C FRAM cell, and the voltage application procedure for both write and read processes. Vw is always applied first in order to address a specific cell. A 2T-1C FRAM cell array is briefly presented in FIG. 6.

As described above, the 2T-1C FRAM according to the present invention performs write/read operations without switching, since each cell of the 2T-1C FRAM includes two transistors and one ferroelectric capacitor so that the "charging" and "discharging" of the ferroelectric capacitor is used in conjunction with the p-n junction of the two transistors. That is, the 2T-1C FRAM is a new FRAM which improves upon the structure of a conventional FRAM which switches its ferrroelectric capacitor as a basic operation in the state where a positive dipole of the ferrroelectric capacitor and a negative dipole of the ferrroelectric capacitor are assigned to "1" and "0", respectively. Therefore, degradation problems such as fatigue and imprint in the 2T-1C FRAM can be avoided. Furthermore, an imprint may be rather beneficial to the 2T-1C FRAM.

What is claimed is:

1. A 2T-1C ferroelectric random access memory comprising:
    a semiconductor substrate having a plurality of potential wells formed by doping the semiconductor substrate with first impurities;
    a plurality of memory cells each having two transistors and one capacitor;
    a plurality of connection lines electrically connecting the memory cells in the form of a matrix; and
    a plurality of dummy capacitors,
    wherein the two transistors include:
        a source formed by doping a semiconductor within each potential well with second impurities;
        a first drain and a second drain formed by doping the semiconductor within each potential well with the second impurities in a predetermined interval, respectively, so as to be arranged in line with the source in a first direction;
        a first gate formed on an insulation layer which is formed on a first channel between the source and the first drain; and
        a second gate formed on an insulation layer which is formed on a second channel between the first drain and the second drain, and
    wherein the one capacitor includes:
        a bottom electrode formed on an insulation layer which is formed on the source;
        a ferroelectric layer formed on the bottom electrode; and
        a top electrode formed on the ferroelectric layer, and
    wherein the connection lines include:
        first word lines connecting the first gate arranged in the first direction in each memory cell;
        bit lines connecting the first drains of the memory cells arranged in the second direction, which is perpendicular to the first direction, and to which the dummy capacitors are commonly connected;
        second word lines connecting the second gate of the memory cells arranged in the second direction;
        sensing lines connecting the second drains of the memory cells arranged in the second direction;
        contact plugs connecting the source and the bottom electrode in each cell; and
        plate lines connecting the top electrodes of the memory cells arranged in the second direction.

2. The 2T-1C ferroelectric random access memory as claimed in claim 1, wherein the first impurities are "p" type impurities and the second impurities are "n$^+$" type impurities.

3. The 2T-1C ferroelectric random access memory as claimed in claim 1, wherein the first impurities are "n" type impurities and the second impurities are "p$^+$" type impurities.

4. The 2T-1C ferroelectric random access memory as claimed in claim 1, wherein the sensing lines connecting the second drains of the memory cells are arranged in the first direction.

5. The 2T-1C ferroelectric random access memory as claimed in claim 1, wherein the dummy capacitor is formed between the bit line and the first drain of each cell.

6. A method for operating a 2T-1C ferroelectric random access memory comprising: a semiconductor substrate having a plurality of potential wells formed by doping it with first impurities; a plurality of memory cells each having two transistors and one capacitor; a plurality of connection lines electrically connecting the memory cells in the form of a matrix; and a plurality of dummy capacitors, wherein the two transistors include: a source formed by doping the semiconductor within each potential well with second impurities; a first drain and a second drain formed by doping the semiconductor within each potential well with the second impurities in a predetermined interval, respectively, so as to be arranged in line with the source in a first direction; a first gate formed on an insulation layer which is formed on a first channel between the source and the first drain; and a second gate formed on an insulation layer which is formed on a second channel between the first drain and the second drain, and wherein the one capacitor includes: a bottom electrode formed on an insulation layer which is formed on the source; a ferroelectric layer formed on the bottom electrode; and a top electrode formed on the ferroelectric layer, and wherein the connection lines include: first word lines connecting the first gates arranged in the first direction in each memory cell; bit lines connecting the first drains of the memory cells arranged in the second direction, which are perpendicular to the first direction, and to which the dummy capacitors are commonly connected; second word lines connecting the second gates of the memory cells arranged in the second direction; sensing lines connecting the second drains of the memory cells arranged in the second direction; contact plugs connecting the source and the bottom electrode in each cell; and plate lines connecting the top electrodes of the memory cells arranged in the second direction, the method comprising the steps of:
    (a) writing "0" state in a selected memory cell by applying the voltage Vw to a first word line and a voltage Vp to a plate line;
    (b) writing "1" state in a selected memory cell by applying the voltage Vw to the first word line and a voltage Vc to a second word line; and
    (c) reading the written state out by applying a voltage Vw to the first word line and the voltage Vc to the second word line and detecting a negative charge at the selected memory cell.

7. The method as claimed in claim 6, wherein the step (c) is performed by detecting the negative charge at the selected memory cell via the sensing line connected to it.

8. The method as claimed in claim 7, wherein, in the step (c), if the negative charge is detected at the selected memory cell, the state of the selected memory cell is read out as "0" state, and if the negative charge is not detected at the selected memory cell, the state of the selected memory cell is read out as "1" state.

9. The method as claimed in claim 7, wherein the step (c) further comprises the step of restoring "0" state in the selected memory cell immediately after the selected memory cell is read out as "0" state, so that "0" state is maintained.

10. The 2T-1C ferroelectric random access memory as claimed in claim 2, wherein the dummy capacitors are formed between the bit line and the first drain of each cell.

11. The 2T-1C ferroelectric random access memory as claimed in claim 3, wherein the dummy capacitors are formed between the bit line and the first drain of each cell.

12. The 2T-1C ferroelectric random access memory as claimed in claim 4, wherein the dummy capacitors are formed between the bit line and the first drain of each cell.

13. The method as claimed in claim 8, wherein the step (c) further comprises the step of restoring "0" state in the selected memory cell immediately after the selected memory cell is read out as "0" state, so that "0" state is maintained.

* * * * *